United States Patent [19]
Suzuki et al.

[11] Patent Number: 5,929,130
[45] Date of Patent: Jul. 27, 1999

[54] PHOTOCURABLE RESIN COMPOSITIONS FOR PLASTIC MOLDS

[75] Inventors: Toshiharu Suzuki; Tatsuhiko Ozaki; Hirokazu Matsueda, all of Aichi; Yorikazu Tamura; Tsuneo Hagiwara, both of Kanagawa, all of Japan

[73] Assignee: Takemoto Yushi Kabushiki Kaisha & Teijin Seiki Co., Ltd., Japan

[21] Appl. No.: 08/673,262

[22] Filed: Jun. 28, 1996

[30] Foreign Application Priority Data

Jun. 29, 1995 [JP] Japan .................................... 7-188525
May 22, 1996 [JP] Japan .................................... 8-151695

[51] Int. Cl.$^6$ .............................. G03C 9/08; C08K 3/08; C08K 3/36; C08K 3/40
[52] U.S. Cl. ................................ 522/81; 522/83; 522/90; 522/96; 524/405; 524/437; 524/425; 524/445; 524/494; 524/493; 524/439; 430/269; 264/401
[58] Field of Search .................................. 522/81, 83, 96, 522/90; 524/405, 437, 425, 445, 494, 493, 439; 430/269; 264/401

[56] References Cited

U.S. PATENT DOCUMENTS

| | | | |
|---|---|---|---|
| 4,942,001 | 7/1990 | Murphy et al. | 522/96 |
| 4,945,032 | 7/1990 | Murphy et al. | 430/269 |
| 5,013,768 | 5/1991 | Kiriyama et al. | 522/94 |
| 5,391,460 | 2/1995 | Dougherty et al. | 522/79 |
| 5,476,749 | 12/1995 | Steinmann et al. | 430/269 |
| 5,591,563 | 1/1997 | Suzuki et al. | 522/96 |

*Primary Examiner*—Susan W. Berman
*Attorney, Agent, or Firm*—Majestic, Parsons, Siebert & Hsue P.C.

[57] ABSTRACT

Photocurable resin compositions capable of producing plastic molds with improved durability by stereolithography in the presence of a photoinitiator includes unsaturated urethane of a specified kind, vinyl monomer of a specified kind, a filler and salt of phosphoric acid ester of specified kinds at a specified ratio.

19 Claims, 1 Drawing Sheet

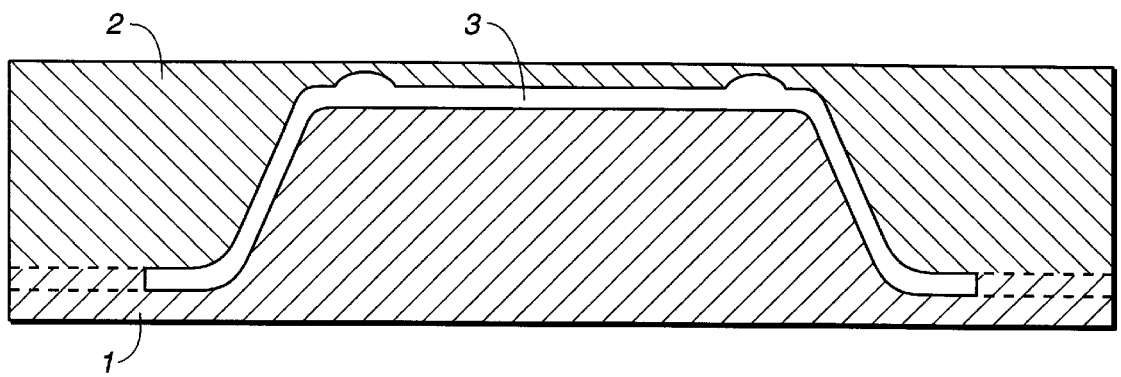
FIG._1
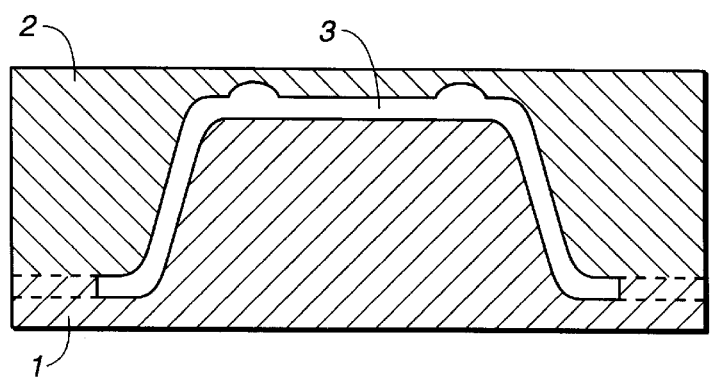
FIG._2

PHOTOCURABLE RESIN COMPOSITIONS FOR PLASTIC MOLDS

BACKGROUND OF THE INVENTION

This invention relates to photocurable resin compositions for plastic molds and to plastic molds made therefrom.

Casings for electrical appliances for home use, electronic devices and communication apparatus, as well as machine parts are frequently made by molding various kinds of plastics. When such molded plastic objects are to be mass-produced, a small number of prototypes are preliminarily produced as a test. For producing such prototypes, and also for making final products if the total number to be produced is not too large, plastic molds are frequently made use of because they can be produced easily. This invention relates to photocurable resin compositions capable of producing such plastic molds directly by stereolithography, as well as plastic molds produced from such photocurable resin compositions by stereolithography.

General prior art methods of producing such plastic molds include the vacuum casting method using silicone resin, the resin transfer molding (RTM) method using unsaturated polyester resin, the hand lay-up method and the spray-up method. These prior art methods are disadvantageous in that they require much time and labor to produce plastic molds because a master model must be made first with a metal, wood, clay or plaster before the production of plastic molds. Indeed, very much labor and time are typically expended for the production of a plastic mold since frequent design changes are made during the production, because it is the very purpose of using plastic molds.

Attempts have also been made at stereo-lithography of photocurable resin compositions based on data inputted in a three-dimensional CAD, and various kinds of photocurable resin compositions for such a purpose have been proposed (for example, U.S. Pat. Nos. 4,942,066 and 5,002,855). These prior art photocurable resin compositions are not satisfactory, however, because thermal and mechanical properties of the plastic molds obtained from them by stereolithography are not sufficiently acceptable and their durability is quite poor. Since the heat distortion temperature of plastic molds obtained from prior art photocurable resin compositions by stereolithography is lower than about 70° C. and their tensile elastic modulus is less than about 8 GPa, the distortion and breakage of plastic molds are significant even when they are used for injection molding of general thermoplastics such as ABS resin such that production of even as few as only about 10–20 prototypes or products is not possible.

SUMMARY OF THE INVENTION

It is therefore an object of this invention to provide photocurable resin compositions capable of producing plastic molds much more quickly than by prior art methods by which a master model must be produced as a first step.

It is another object of this invention to provide such photocurable resin compositions from which it is possible to produce plastic molds with much better thermal and mechanical properties and hence better durability than those obtained from prior art photocurable resin compositions by stereolithography.

This invention is based on the discovery by the present inventors, as a result of their diligent studies in view towards the aforementioned problems of prior art technology, that use should be made of photocurable resin compositions with unsaturated urethane, vinyl monomer, a filler and ester phosphate of specified kinds at specified ratios for stereolithography.

BRIEF DESCRIPTION OF THE DRAWINGS

The accompanying drawings, which are incorporated in and form a part of this specification, illustrate embodiments of the invention and, together with the description, serve to explain the principles of the invention. In the drawings:

FIG. 1 is a longitudinal sectional view of a plastic mold produced as an example according to this invention; and FIG. 2 is a transverse sectional view of the plastic mold of FIG. 1.

DETAILED DESCRIPTION OF THE INVENTION

Photocurable resin compositions according to this invention are characterized as containing a photocurable liquid, 50–400 weight parts of a filler per 100 weight parts of the photocurable liquid, which is a mixture of inorganic fine particles and inorganic whiskers with average fiber length of 1–70 μm and 0.1–5 weight parts of salt of phosphoric acid ester which is shown by Formula (1) given below:

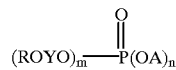

Formula (1)

per 100 weight parts of the filler, the photocurable liquid being a mixture of unsaturated urethane of the kind described below and vinyl monomer of the kind described below at a weight ratio of (unsaturated urethane)/(vinyl monomers)=80/20–40/60, and the inorganic whiskers being surface-treated with (meth)acryloyl-modified silane or vinyl-modified silane, where the unsaturated urethane of the aforementioned kind is characterized wherein there are within the molecule three or more methacryloyl and acryloyl groups as radical polymerizable groups and the molecular weight per radical polymerizable group is 150–250 on the average, the vinyl monomer is either N-(meth)acryloyl morpholine or a mixture of N-(meth)acryloyl morpholine and di-ol di(meth)acrylate, and in Formula (1) R is a hydrocarbon group with 1–6 carbon atoms, Y is a residual group obtained by removing hydroxyl groups of polyether di-ol, A is monoamine base and m and n are each 1 or 2 such that m+n=3. The invention also relates to plastic molds obtained from such a photocurable resin composition by stereolithography with an energy beam in the presence of a photopolymerization initiator.

The unsaturated urethane according to this invention in the aforementioned photocurable liquid is characterized wherein there are within the molecule three or more methacryloyl and acryloyl groups as radical polymerizable groups and the molecular weight per radical polymerizable group is 150–250 on the average. Such unsaturated urethane may be selected from known kinds of unsaturated urethane, examples thereof including: (1) unsaturated urethane obtained from 1 mole of polyisocyanate having isocyanate functionality of n and n moles of (meth)acrylic partial ester of poly-ol having a hydroxy group in the molecule (hereinafter referred to as (meth)acryl ester mono-ol) (as disclosed in Japanese Patent Publication Tokkai 4-72353); (2) unsaturated urethane obtained from 1 mole of n-hydric poly-ol, n mole of diisocyanate and n mole of aforementioned (meth)acryl ester mono-ol (as disclosed in Japanese Patent Publication Tokkai 2-145616); (3) unsaturated urethane obtained from 1 mole of n-hydric poly-ol and n mole of isocyanatoalkyl (meth)acrylate (as disclosed in Japanese Patent Publications Tokkai 3-163116 and 6-199962); (4) unsaturated urethane obtained from 1 mole of poly-ol (meth)

acrylate having 2 free hydroxyl groups in the molecule and n mole of isocyanate alkyl (meth)acrylate (as disclosed in Japanese Patent Publication Tokkai 4-53809); and (5) mixtures of unsaturated urethane described in (1)–(4) above.

As described above, the present invention makes use of unsaturated urethane characterized wherein there are within the molecule three or more methacryloyl and acryloyl groups as radical polymerizable groups and the molecular weight per radical polymerizable group, as an indicator of the concentration of such radical polymerizable groups, is 150–250 on the average. Unsaturated urethane having such concentration of radical polymerizable groups can be obtained by appropriately selecting a material for general synthesis of unsaturated urethane. In the case of polycyanate, for example, the molecular weight and the number of functional hydroxy groups are appropriately selected for a combination. In the case of partial ester for poly-ol (meth)acrylate, the number of functional (meth) acryloyl groups and other factors are appropriately selected for a combination.

The unsaturated urethane according to this invention, as described above, contains within its molecule three or more methacryloyl and acryloyl groups as radical polymerizable groups. More particularly, it is preferred that the molar ratio of methacrylate groups/acryloyl groups be 1/3–3/1 and that 3–8 of such radical polymerizable groups be contained in the molecule. Examples of such preferred unsaturated urethane include: (1) group of reaction products of diisocyanate and tri-ol monomethacrylate•monoacrylate at molar ratio of 1/2, reaction products of diisocyanate/tri-ol monomethacrylate•monoacrylate/di-ol monomethacrylate at molar ratio of 1/1/1, and reaction products of diisocyanate/tri-ol monomethacrylate•monoacrylate/di-ol monoacrylate at molar ratio of 1/1/1; (2) group of reaction products of diisocyanate/tri-ol monomethacrylate•monoacrylate/tri-ol dimethacrylate at molar ratio of 1/1/1 and reaction products of diisocyanate/ tri-ol monometh-acrylate•monoacrylate/triol diacrylate at molar ratio of 1/1/1; (3) group of reaction products of tri-ol/diisocyanate/tri-ol monomethacrylate•monoacrylate at molar ratio of 1/3/3, reaction products of tri-ol/ diisocyanate/tri-ol monomethacrylate•monoacrylate/di-ol monomethacrylate at molar ratio of 1/3/2/1 or 1/3/1/2, and reaction products of tri-ol/diisocyanate/tri-ol monomethacrylate•monoacrylate/di-ol monoacrylate at molar ratio of 1/3/2/1 or 1/3/1/2; (4) group of reaction products of tetraol/diisocyanate/tri-ol monomethacrylate•monoacrylate at molar ratio of 1/4/4, reaction products of tetraol/diisocyanate/tri-ol monomethacrylate•monoacrylate/di-ol monomethacrylate at molar ratio of 1/4/3/1 and 1/4/2/2, and reaction products of tetraol/diisocyanate/tri-ol monomethacrylate•monoacrylate/di-ol monoacrylate at molar ratio of 1/4/3/1 and 1/4/2/2; and (5) group of reaction products of tetra-ol/diisocyanate/di-ol monomethacrylate/ di-ol mono-acrylate at molar ratio of 1/4/2/2 and 1/4/3/1.

Aromatic diisocyanate was used as diisocyanate according to this invention in each of the aforementioned unsaturated urethane. Unsaturated urethane of groups (1), (3) and (4) with molecular weight of 150–215 per radical polymerizable group on the average are particularly preferable.

Examples of materials that may be used preferably for the synthesis of aforementioned unsaturated urethane include: (1) dihydric alcohols such as ethylene glycol, propylene glycol, 1,4-butane di-ol and 1,6-hexane di-ol as well as their mono(meth)acrylate; (2) tri-hydric alcohols such as glycerine and trimethylolpropane, tri-ols such as polyether tri-ol such as their ethylene oxide or propylene oxide adducts and their monometh-acrylate•monoacrylate; and (3) polyether tetra-ols such as pentaerythritol and ethylene oxide or propylene oxide adducts of pentaerythritol. Known kinds of aromatic diisocyanate can be used but tolylene diisocyanate and methylene-bis-(4-phenylisocyanate) are preferred.

It is for the following reasons that the unsaturated urethane for photocurable liquid according to this invention should have molecular weight within the range specified above per radical polymerizable group contained therein. If use is made of unsaturated urethane with molecular weight less than 150 per radical polymerizable group, generation of deformation and micro-cracks caused by internal stress is significant in plastic molds produced therefrom. If use is made of unsaturated urethane with molecular weight greater than 250 per radical polymerizable group, on the other hand, desired levels of thermal and mechanical properties cannot be reached by plastic molds produced therefrom.

The vinyl monomer which is the other constituent of the photocurable liquid is N-(meth)acryloyl morpholine alone or a mixture of N-(meth)acryloyl morpholine and di-ol di(meth)acrylate. Examples of N-(meth)acryloyl morpholine include N-acryloyl morpholine and N-methacryloyl morpholine but N-methacryloyl morpholine is more preferred. Examples of di(meth) acrylate to be mixed with N-(meth)acryloyl morpholine include: (1) diacrylates and dimethacrylates of alkane di-ol with 2–6 carbon atoms such as ethylene glycol, propylene glycol, 1,4-butane di-ol, neopentyl glycol and 1,6-hexane di-ol; (2) diacrylates and dimethacrylates of di-ols having alicyclic hydrocarbon group with 6–12 carbon atoms such as cyclohexane dimethanol, cyclohexene dimethanol and dicyclopentyl dimethanol; (3) diacrylates and dimethacrylates of (poly) ester di-ol such as diacrylates and dimethacrylates of 1,6-hexane di-ol hydroxycaprate and diacrylates and dimethacrylates of neopentyl glycol hydroxy pivalate obtained by reacting aliphatic lactone or aliphatic monohydroxyl carboxylic acid with 4–6 carbon atoms with aforementioned alkane di-ol or di-ols; and (4) diacrylates and dimethacrylates of alkoxylated bisphenols with alkoxyl group with 2–3 carbon atoms such as 2,2-bis(hydroxy ethoxy phenyl) propane, 2,2-bis(hydroxy diethoxy phenyl) propane, bis(hydroxy propoxy phenyl)methane and bis (hydroxy dipropoxy phenyl)methane. Preferred among these are diacrylates of alkane di-ol, diacrylates of di-ols having alicyclic hydrocarbon group and diacrylates of alkoxylated bisphenol.

According to this invention, it is preferred to use a mixture of N-(meth)acryloyl morpholine and di-ol di(meth) acrylate as vinyl monomer. In this case, it is preferable to cause N-(meth)acryloyl morpholine to be contained in the vinyl monomer by 50 weight %, and it is even more preferred to have it contained by 60 weight % or more in the vinyl monomer.

The ratio of unsaturated urethane and vinyl monomer in the photocurable liquid according to this invention is unsaturated urethane/vinyl monomer=80/2040/60 (by weight), and preferably 70/30–50/50.

As described above, photocurable resin compositions for plastic molds according to this invention contain a filler by 50–400 weight parts against 100 weight parts of photocurable liquid as described above. In this situation, the filler is a mixture of inorganic fine particles and inorganic whiskers of average fiber length 1–70 μm, and surface-treated with (meth)acryloyl modified silane or vinyl modified silane (hereinafter referred to as a silane coupling agent).

Common examples of inorganic fine particles include silica, clay, calcium carbonate, glass beads and all kinds of metallic powder with average particle diameter 0.1–50 μm. Of the above examples, glass beads are preferable, and glass beads with average particle diameter 3–30 μm, and surface-treated with a silane coupling agent are even more preferred.

Examples of aforementioned inorganic whiskers include potassium titanate fibers, alumina fibers, magnesium sulfate fibers, magnesium borate fibers and aluminum borate fibers, all surface-treated with a silane coupling agent and having average fiber length of 1–70 µm. Of these, aluminum borate fibers with fiber diameter of 0.3–1 µm and average fiber length of 10–20 µm are preferred.

Examples of the silane coupling agent to be used for treating the surfaces of inorganic whiskers and glass beads include: (1) (meth)acryloyl modified alkoxy silane such as (meth)acryloyl oxypropyl trimethoxy silane and di(meth)acryloyl oxypropyl dimethoxy silane; and (2) vinyl modified alkoxy silane such as vinyl trimethoxy silane, divinyl dimethoxy silane, vinyloxypropyl trimethoxy silane and divinyloxypropyl dimethoxy silane. Of these, methacryloyl oxypropyl trimethoxy silane is preferred. No limitation is imposed on the method of surface treating of inorganic whiskers or glass beads by using such a silane coupling agent or on the amount to be used for the surface treating. In general, however, a silane coupling agent is used at the rate of 0.1–20 weight % of the objects to be treated, and more particularly 1–10 weight %.

It is particularly preferred to use as the filler according to this invention a combination of glass beads with average particle diameter of 3–30 µm and surface-treated with a silane coupling agent and aluminum borate fibers with fiber diameter 0.3–1 µm and average fiber length of 10–20 µm also surface-treated with a silane coupling agent. In this application, it is most preferable to have 40–300 weight parts of the former and 10–100 weight parts of the latter contained against 100 weight parts of the photocurable liquid.

In addition to a photocurable liquid and a filler as described above, photocurable resin compositions according to this invention also contain salt of phosphoric acid ester shown by aforementioned Formula (1). The salt of phosphoric acid ester shown by Formula (1) is obtained by using monoamine to neutralize acidic phosphoric acid esters obtained by phosphorizing polyether di-ol with one end closed by a hydrocarbon group.

In Formula (1), Y is a residual group obtained by removing a hydroxyl group of polyether di-ol. Examples of such polyether di-ol include polyoxy ethylene di-ol, polyoxy propylene di-ol, polyoxy butylene di-ol and polyoxy alkylene di-ol having two or more different kinds of oxyalkylene units. Among such polyether di-ols, those with repetition number of oxyalkylene units in the range of 5–100 are preferable and those in the range of 15–60 are even more preferable. Those with the oxyalkylene units comprising oxypropylene units or both oxypropylene units and oxyethylene units with molar % ratio of oxypropylene units/oxyethylene units=100/0–50/50 can be used advantageously.

The hydrocarbon groups which close one end of such polyether di-ols, as described above, are hydrocarbon groups with 1–6 carbon atoms. Examples of such hydrocarbon groups include: (1) alkyl groups such as methyl group, ethyl group, isopropyl group, butyl group and hexyl group; (2) cyclohexyl group; and (3) phenyl group. Of these, alkyl groups with 2–4 carbon atoms are preferred.

In Formula (1), A indicates a monoamine base which forms acidic phosphoric acid ester and salt. Examples of such monoamine base include: (1) alkanolamines such as monoethanolamine, diethanolamine, triethanolamine and isopropanolamine; (2) N-alkylalkanolamines such as methyl diethanolamine, ethyl monoethanolamine and butyl diethanolamine; and (3) cyclic amines such as morpholine and pyridine. Of the above, morpholine is preferred.

According to this invention, the content of the salt of phosphoric acid ester shown by Formula (1) is 0.1–5 weight parts against 100 weight parts of the aforementioned filler, but it is preferably in the range of 0.5–3 weight parts.

When a photocurable resin composition according to this invention is used for stereolithography, a photoinitiator is initially caused to be contained therein. The invention does not impose any particular limitation on the kind of photoinitiator to be used. Examples of such photoinitiator include: (1) carbonyl compounds such as benzoin, α-methyl benzoin, anthraquinone, chloroanthraquinone and acetophenone; (2) sulfur compounds such as diphenyl sulfide, diphenyl disulfide and dithiocarbamate; and (3) polycyclic aromatic compounds such as α-chloromethyl naphthalene and anthracene. The content of photoinitiator in a photocurable resin composition for plastic molds is generally 0.1–10 weight parts, and more preferably 1–5 weight parts, to 100 weight parts of the photocurable liquid.

In addition to a photoinitiator, use may also be made of a co-initiator such as n-butyl amine, triethanol amine, N,N-dimethyl aminobenzene sulfonic diallylamide and N,N-dimethyl aminoethyl methacrylate.

This invention does not impose any particular limitation on the method of stereolithography by the use of a photocurable resin composition. Known methods may be used for this purpose. There is a method, for example, by which a photohardening layer is initially formed with a photocurable resin composition, the photocurable resin composition is supplied again on top of the photohardening layer to form another such layer and this process is repeated until a desired plastic mold is formed. The plastic mold thus produced may be subjected further to a post-cure process, if necessary. Examples of energy beam which can be used for hardening include visible light rays, ultraviolet rays and electron beams, but the use of ultraviolet rays is preferable.

Plastic molds according to this invention are obtained directly from a photocurable resin composition by stereolithography on the basis of data inputted to a three-dimensional CAD. They can be produced much more quickly and have better thermal and mechanical properties than those produced by general prior art methods requiring a master model. In particular, if the unsaturated urethane serving as a constituent of the photocurable liquid is a reaction product of aromatic diisocyanate and monomethacrylate•monoacrylate of trihydric alcohol at molar ratio of 1/2 or a reaction product of aromatic diisocyanate, monometh-acrylate•monoacrylate of trihydric alcohol and hydroxy alkylacrylate at molar ratio of 1/1/1, if the filler comprises glass beads of average particle diameter of 3–30 µm and aluminum borate fibers of fiber diameter of 0.3–1.0 µm and average fiber length of 1–20 µm, both surface processed with (meth)acryloyl modified silane or vinyl modified silane, and if the photocurable resin composition contains the photocurable liquid, the glass beads and the aluminum borate fibers at weight ratio of 100/40–300/10–100, plastic molds of this invention produced from such a photocurable resin composition have heat distortion temperature higher than 240° C. and tensile elastic modulus greater than 17 GPa. Thus, the present invention can be applied to injection molding and compression molding of not only general thermoplastics but also some engineering plastics and thermosetting resins, and can be useful for the production of only a small number of prototypes as well as of finished products.

Next, nine representative examples (S-1)–(S-9) of photocurable resin composition according to this invention and plastic molds obtained from these compositions are described.

Composition (S-1)

Composition (S-1) includes: 100 weight parts of photocurable liquid (A-1) obtained by mixing 60 weight parts of unsaturated urethane (a-1), obtained by reacting tolylene diisocyanate and glycerine monomethacrylate•monoacrylate at molar ratio of 1/2, with 40 weight parts of N-acryloyl morpholine (vinyl monomer (b-1)) as vinyl monomer; 200 weight parts of glass beads (inorganic fine particles (D-1)) with average particle diameter of 17 μm and surface-treated with methacryloyl oxypropyl trimethoxy silane and 50 weight parts of aluminum borate fibers (inorganic whiskers (E-1)) with fiber diameter 0.8 μm and average fiber length 20 μm surface-treated with methacryloyl oxypropyl trimethoxy silane, as a filler; and 2.5 weight parts of morpholine salt of phosphoric acid ester salt of methoxy polyoxypropylene di-ol of average molecular weight 2000 (salt of phosphoric acid ester (F-1)).

Composition (S-2)

Composition (S-2) includes: 100 weight parts of photocurable liquid (A-2) obtained by mixing 60 weight parts of unsaturated urethane (a-2), obtained by reacting tolylene diisocyanate, glycerine monomethacrylate•monoacrylate and hydroxy ethylacrylate at molar ratio of 1/1/1, with 40 weight parts of aforementioned vinyl monomer (b-1); 200 weight parts of aforementioned inorganic fine particles (D-1); 50 weight parts of aforementioned inorganic whiskers (E-1); and 2.5 weight parts of aforementioned salt of phosphoric acid ester (F-1).

Composition (S-3)

Composition (S-3) includes: 100 weight parts of photocurable liquid (A-3) obtained by mixing 50 weight parts of aforementioned unsaturated urethane (a-1), 50 weight 33 weight parts of aforementioned vinyl monomer (b-1) and 17 weight parts of dicyclopentyl dimethylene•diacrylate (vinyl monomer (c-1)); 200 weight parts of aforementioned inorganic fine particles (D-1) and 50 weight parts of aluminum borate fibers with fiber diameter 1.0 μm and average fiber length 40 μm and surface-processed with vinyl trimethoxy silane (inorganic whiskers (E-2)); and 2.5 weight parts of aforementioned salt of phosphoric acid ester (F-1).

Composition (S-4)

Composition (S-4) includes: 100 weight parts of photocurable liquid (A-4) obtained by mixing 50 weight parts of aforementioned unsaturated urethane (a-2), 33 weight parts of aforementioned vinyl monomer (b-1) and 17 weight parts of aforementioned vinyl monomer (c-1); 200 weight parts of aforementioned inorganic fine particles (D-1); 50 weight parts of aforementioned inorganic whiskers (E-1); and 2.5 weight parts of aforementioned salt of phosphoric acid ester (F-1).

Composition (S-5)

Composition (S-5) includes: 100 weight parts of photocurable liquid (A-5) obtained by mixing 60 weight parts of unsaturated urethane (a-3), obtained by reacting isophorone diisocyanate and glycerine monomethacrylate•monoacrylate at molar ratio of 1/2, 30 weight parts of aforementioned vinyl monomer (b-1) and 10 weight parts of neopentyl glycol hydroxy pivalate•diacrylate (vinyl monomer (c-2)); 200 weight parts of aforementioned inorganic fine particles (D-1) and 50 weight parts of aforementioned inorganic whiskers (E-1); and 2.5 weight parts of aforementioned salt of phosphoric acid ester (F-1).

Composition (S-6)

Composition (S-6) includes: 100 weight parts of photocurable liquid (A-6) obtained by mixing 60 weight parts of unsaturated urethane (a-4), obtained by reacting isophorone diisocyanate, glycerine monomethacrylate•monoacrylate and hydroxy ethylacrylate at molar ratio of 1/1/1, 30 weight parts of aforementioned vinyl monomer (b-1) and 10 weight parts of aforementioned vinyl monomer (c-2); 200 weight parts of aforementioned inorganic fine particles (D-1) and 50 weight parts of aforementioned inorganic whiskers (E-1); and 2.5 weight parts of aforementioned salt of phosphoric acid ester (F-1).

Composition (S-7)

Composition (S-7) includes: 100 weight parts of photocurable liquid (A-7) obtained by mixing 50 weight parts of unsaturated urethane (a-5), obtained by reacting polypropoxylated glycerine (average molecular weight of 270), tolylene diisocyanate and glycerine monomethacrylate•monoacrylate at molar ratio of 1/3/3, 33 weight parts of aforementioned vinyl monomer (b-1) and 17 weight parts of aforementioned vinyl monomer (c-1); 200 weight parts of aforementioned inorganic fine particles (D-1) and 50 weight parts of aforementioned inorganic whiskers (E-1); and 2.5 weight parts of aforementioned salt of phosphoric acid ester (F-1).

Composition (S-8)

Composition (S-8) includes: 100 weight parts of photocurable liquid (A-8) obtained by mixing 60 weight parts of unsaturated urethane (a-6), obtained by reacting glycerine, tolylene diisocyanate and glycerine monomethacrylate•monoacrylate at molar ratio of 1/3/3, 30 weight parts of aforementioned vinyl monomer (b-1) and 10 weight parts of aforementioned vinyl monomer (c-2); 200 weight parts of aforementioned inorganic fine particles (D-1) and 50 weight parts of aforementioned inorganic whiskers (E-1); and 2.5 weight parts of aforementioned salt of phosphoric acid ester (F-1).

Composition (S-9)

Composition (S-9) includes: 100 weight parts of aforementioned photocurable liquid (A-1); 200 weight parts of aforementioned inorganic fine particles (D-2) and 50 weight parts of aforementioned inorganic whiskers (E-1); and 2.5 weight parts of aforementioned salt of phosphoric acid ester (F-1).

Aforementioned photocurable resin compositions (S-1)–(S-9) were used in the presence of a photoinitiator to obtain molded objects by stereolithography, and these stereolithographed objects were cured to obtain plastic molds with an upper part and a lower part.

In what follows, the present invention and its effects will be explained more in detail by way of test examples and comparison examples, but it goes without saying that the scope of this invention is not intended to be limited by these examples. In what follows, "parts" will mean "weight parts" and "%" will means "weight %".

Test Examples

Part 1: (Preparation of Photocurable Liquids)

Unsaturated urethane (a-1) (reaction product of tolylene diisocyanate and glycerine monomethacrylate•monoacrylate at molar ratio of 1/2) was prepared by the method described in Japanese Patent Publication Tokkai 6-199962. Photocurable liquid (A-1) was prepared by mixing and dissolving 60 parts of synthesized unsaturated urethane (a-1) and 40 parts of N-acryloyl morpholine. Photocurable liquids (A-2)–(A-8) and (R-1)–(R-9) were similarly prepared. They are all summarized in Table

TABLE 1

| Photocurable Liquid | Unsaturated Urethane Kind | Unsaturated Urethane Amount (Part) | Vinyl Monomers Kind | Vinyl Monomers Amount (Part) |
|---|---|---|---|---|
| A-1 | a-1 | 60 | b-1 | 40 |
| A-2 | a-2 | 60 | b-1 | 40 |
| A-3 | a-1 | 50 | b-1/c-1 | 33/17 |
| A-4 | a-2 | 50 | b-1/c-1 | 33/17 |
| A-5 | a-3 | 60 | b-1/c-2 | 30/10 |
| A-6 | a-4 | 60 | b-1/c-2 | 30/10 |
| A-7 | a-5 | 50 | b-1/c-1 | 33/17 |
| A-8 | a-6 | 60 | b-1/c-2 | 30/10 |
| R-1 | r-1 | 60 | b-1 | 40 |
| R-2 | r-2 | 60 | b-1 | 40 |
| R-3 | r-1 | 50 | b-1/c-2 | 33/17 |
| R-4 | r-2 | 50 | b-1/c-2 | 33/17 |
| R-5 | a-1 | 60 | c-1 | 40 |
| R-6 | r-3 | 46 | c-3/c-4 | 38/16 |
| R-7 | a-1 | 50 | c-3 | 50 |
| R-8 | r-4 | 50 | b-1/c-1 | 33/17 |
| R-9 | r-5 | 60 | b-1/c-2 | 30/10 |

In Table 1:
a-1: Reaction product of tolylene diisocyanate and glycerine monomethacrylate.monoacrylate at molar ratio of ½ molecular weight = 151 per radical polymerizable group;
a-2: Reaction product of tolylene diisocyanate, glycerin monomethacrylate.monoacrylate and hydroxy ethylacrylate a molar ratio of 1/1/1, molecular weight = 168 per radical polymerizable group;
a-3: Reaction product of isophorone diisocyanate and glycerin monomethacrylate.monoacrylate at molar ratio of ½ molecular weight = 163 per radical polymerizable group;
a-4: Reaction product of isophorone diisocyanate, glycerin monomethacrylate.monoacrylate and hydroxy ethylacrylate a molar ratio of 1/1/1, molecular weight = 184 per radical polymerizable group;
a-5: Reaction product of polypropoxylated glycerine (average molecular weight of 270), tolylene diisocyanate an glycerine monomethacrylate.monoacrylate at molar ratio of 1/3/3, molecular weight = 240, per radical polymerizable group;
a-6: Reaction product of obtained by reacting glycerine, tolylene diisocyanate and glycerine monomethacrylate.monoacrylate at molar ratio of 1/3/3, molecular weight = 209 per radical polymerizable group;
r-1: Reaction product of glycerine dimethacrylate and diphenylmethane diisocyanate at molar ratio of 2/1;
r-2: Reaction product of glycerine diacrylate, hydroxy ethylacrylate and tolylene diisocyanate at molar ratio of 1/1/1;
r-3: Reaction product of poly(average = 4)neopentyl adipate, isophorone diisocyanate trimer and hydroxy ethylacrylate at molar ratio of 1/2/4 (unsaturated urethane described in Japanese Patent Publications Tokkai 7-26060 and 7-26062);
r-4: Reaction product of glycerine polycaprolactone tri-ol (average molecular weight = 1200), isophorone diisocyanate, glycerine monomethacrylate.monoacrylate and hydroxyethyl methacrylate at molar ratio of 1/3/1.5/1.5, molecular weight = 534 per radical polymerizable group;
r-5: Reaction product of glycerine monomethacrylate.monoacrylate and isocyanatoethyl methacrylate at molar ratio of 1/1, molecular weight = 123 per radical polymerizable qroup;
b-1: N-acryloyl morpholine;
c-1: Dicyclopentyl dimethylene.diacrylate;
c-2: Neopentylglycol.hydroxy pivalate.diacrylate;
c-3: Polyethylene glycol(molecular weight 200) diacrylate;
c-4: Polyethoxylated trimethylol propane triacrylate.

Part 2: (Preparation of Photocurable Resin Compositions For Plastic Molds)

Placed inside a mixer equipped with a double-axis stirrer were 100 parts of photocurable liquid (A-1) described in Part 1, 200 parts of glass beads with average particle diameter of 17 μm and surface-processed with methacryloyl oxypropyl trimethoxysilane, 50 parts of aluminum borate fibers with fiber diameter 0.8 μm and average fiber length of 20 μm and surface-processed with methacryloyl oxypropyl trimethoxysilane and 2.5 parts of morpholine salt of methoxypolyoxypropylene di-ol with average molecular weight of 2000, and the mixture was stirred until it became uniform. The stirred mixture was passed through a 50 μm filter to obtain photocurable resin composition (S-1) (Test Example 1). Compositions (S-2)–(S-9) (Test Examples 2–9) and (Q-1)–(Q-15) (Comparison Examples 1–15) were similarly prepared. Their compositions are shown in Table 2.

TABLE 2

| Examples | Photo-curable Comp. Kind | Photo-curable Liquid Kind | Inorganic Fine Particles Kind | Inorganic Fine Particles Amount (Part) | Inorganic Whiskers Kind | Inorganic Whiskers Amount (Part) | Salt of Phosphoric Acid Kind | Salt of Phosphoric Acid Amount (Part) |
|---|---|---|---|---|---|---|---|---|
| Test Examples | | | | | | | | |
| 1 | S-1 | A-1 | D-1 | 200 | E-1 | 50 | F-1 | 2.5 |
| 2 | S-2 | A-2 | D-1 | 200 | E-1 | 50 | F-1 | 2.5 |
| 3 | S-3 | A-3 | D-1 | 200 | E-2 | 50 | F-1 | 2.5 |
| 4 | S-4 | A-4 | D-1 | 200 | E-1 | 50 | F-1 | 2.5 |
| 5 | S-5 | A-5 | D-1 | 200 | E-1 | 50 | F-1 | 2.5 |
| 6 | S-6 | A-6 | D-1 | 200 | E-1 | 50 | F-1 | 2.5 |
| 7 | S-7 | A-7 | D-1 | 200 | E-1 | 50 | F-1 | 2.5 |
| 8 | S-8 | A-8 | D-1 | 200 | E-2 | 50 | F-1 | 2.5 |
| 9 | S-9 | A-1 | D-2 | 200 | E-2 | 50 | F-1 | 2.5 |
| Comparison Examples | | | | | | | | |
| 1 | Q-1 | R-1 | D-1 | 200 | E-1 | 50 | F-1 | 2.5 |
| 2 | Q-2 | R-2 | D-1 | 200 | E-1 | 50 | F-1 | 2.5 |
| 3 | Q-3 | R-3 | D-1 | 200 | E-1 | 50 | F-1 | 2.5 |
| 4 | Q-4 | R-4 | D-1 | 200 | E-1 | 50 | F-1 | 2.0 |
| 5 | Q-5 | A-1 | — | — | E-1 | 50 | F-1 | 1.0 |
| 6 | Q-6 | A-1 | D-1 | 200 | — | — | F-1 | 2.0 |
| 7 | Q-7 | A-1 | D-1 | 200 | E-3 | 50 | F1 | 2.5 |
| 8 | Q-8 | A-1 | D-1 | 200 | E-1 | 50 | — | — |

TABLE 2-continued

| Examples | Photo-curable Comp. Kind | Photo-curable Liquid Kind | Inorganic Fine Particles Kind | Amount (Part) | Inorganic Whiskers Kind | Amount (Part) | Salt of Phosphoric Acid Kind | Amount (Part) |
|---|---|---|---|---|---|---|---|---|
| 9  | Q-9  | A-2 | D-1 | 30  | E-2 | 10  | F-1 | 0.5 |
| 10 | Q-10 | R-5 | D-1 | 200 | E-3 | 50  | F-1 | 2.5 |
| 11 | Q-11 | R-6 | D-1 | 223 | —   | —   | F-1 | 0.5 |
| 12 | Q-12 | R-6 | —   | —   | E-1 | 47  | F-1 | 0.5 |
| 13 | Q-13 | R-7 | —   | —   | E-1 | 100 | —   | —   |
| 14 | Q-14 | R-8 | D-1 | 200 | E-1 | 50  | F-1 | 2.5 |
| 15 | Q-15 | R-9 | D-1 | 200 | E-1 | 50  | F-1 | 2.5 |

In Table 2:
Amount of photocurable liquid: 100 parts in all examples;
D-1: Glass beads with average particle diameter of 17 μm and surface-treated with methacryloyl oxypropyl trimethoxy silane;
D-2: Glass beads with average particle diameter of 17 μm and not surface-treated;
E-1: Aluminum borate fibers with fiber diameter 0.8 μm and average fiber length 20 μm and surface-treated with methacryloyl oxypropyl trimethoxy silane;
E-2: Aluminum borate fibers with fiber diameter 1.0 μm and average fiber length 40 μm and surface-treated with vinyl trimethoxy silane;
E-3: Aluminum borate fibers with fiber diameter 0.8 μm and average fiber length 20 μm and not surface-treated;
F-1: Morpholine salt of phosphoric acid ester salt of methoxy polyoxypropylene di-ol of average molecular weight 2000;
Comparison Example 11: Described in Japanese Patent Publication Tokkai 7-26060;
Comparison Example 12: Described in Japanese Patent Publicaion Tokkai 7-26062; and
Comparison Example 13: Described Japanese Patent Publication Tokkai 6-199962.

Part 3: (Preparation and Evaluation of Plastic Molds)

(1) Preparation of Plastic Molds

An apparatus for stereolithography consisting mainly of a three-dimensional NC table equipped with a container and a control system of helium-cadmium laser beam (output=25 mW; wavelength=3250Å) was used. This container was filled with dissolved mixtures of the photocurable resin compositions prepared in Part 2 and the photoinitiators shown in Table 3 (hereinafter referred to as liquid mixtures). After each liquid mixture was supplied from this container onto a horizontal plane (determined by X-axis and Y-axis) such that the thickness would be 0.1 mm, its surface (in the X-Y plane) was scanned in the perpendicular direction (along the Z-axis) by a focused helium-cadmium laser beam according to preliminarily inputted data in the three-dimensional CAD to harden a specified portion. The liquid mixture was newly supplied onto this hardened portion to a thickness of 0.1 mm and hardened in a similar manner. This process was repeated until a total of 550 layers were stacked up to produce a bottom part of a toy bathtub by stereolithography. Similarly, 600 layers were formed to mold a top part of the toy bathtub which would form a pair with the aforementioned bottom part. After the top and bottom parts thus produced were washed with isopropyl alcohol, they were irradiated with a 3 KW ultraviolet lamp for 30 minutes and further heated at 100° C. for 2 hours as a post-cure process to produce a plastic mold.

FIG. 1 is a longitudinal sectional view of the plastic mold produced as described above, and FIG. 2 is its transverse sectional view. The mold has a bottom part 1 and a top part 2 which together form a pair, having a molding space 3 formed therebetween. The bottom part 1 is provided with a gas vent (not shown) connecting the molding space 3 with the exterior. The toy bathtub to be formed in the molding space 3 is a hollow container generally shaped like an inverted trapezoid with external dimensions of 177×110 mm for the planar surface, 105×65 mm for the bottom surface and 45 mm in height.

(2) Compression Molding Test

The plastic mold produced as described in (1) was set on a 50-ton oil press equipped with electric heaters and heated until the bottom part reached the set temperature of 145° C. and the top part reached 140° C. Zinc stearate was applied to the inner surfaces of the bottom and top parts as mold release agent. A bulk molding compound (BMC), comprising 85 parts of unsaturated polyester resin (Model 7341 produced by Nippon Upica Corporation), 5 parts of polystyrene, 10 parts of styrene monomer, 200 parts of aluminum hydroxide (B-103 produced by Nippon Keikinzoku Corporation), 3 parts of zinc stearate, 1 part of magnesium oxide, 1.5 parts of benzoyl peroxide and 90 parts of glass fibers with average fiber length of 3 mm, was inserted between the bottom and top parts for compression molding at 40-ton pressure for 4 minutes. The number of times this molding process could be repeated until either the top part or the bottom part became damaged or deformed is also shown in Table 3.

(3) Evaluation of Mechanical Properties

Dumbbell-shaped objects with thickness of 3.0 mm, as specified by JIS-K7113, were prepared by stereolithography as in (1). After they were washed in isopropyl alcohol, they were subjected to a post-cure process at 98° C. for 2 hours to produce test pieces. Three identical test pieces of each kind were prepared and their tensile strength and tensile elastic modulus were measured at pulling speed of 5 mm/second according to JIS-K7113. The average of tests on three test pieces is shown in Table 3.

(4) Evaluation of Thermal Properties

Columnar test pieces of 10×4×127 mm were prepared as described above in (3), and their heat distortion temperature (HDT) at bending force of 181.4 MPa was measured according to JIS-K7207. The result is shown in Table 3.

As can be seen, the present invention makes it possible to produce plastic molds much more quickly than by prior art methods which require a master model to be produced first. Plastic molds according to this invention have superior thermal and mechanical properties and hence improved durability compared to plastic molds made by prior art methods which use a known photocurable composition.

TABLE 3

| Example | Photocurable Composition | Photo-Initiator Kind | Photo-Initiator Amount (Part) | Tensile Strength (MPa) | Tensile Elastic Modulus (GPa) | Thermal Property HDT (°C.) | Number of Times |
|---|---|---|---|---|---|---|---|
| Test Examples: | | | | | | | |
| 10 | S-1 | G-1 | 3 | 76.5 | 17.8 | 274 | 112 |
| 11 | S-2 | G-1 | 3 | 79.4 | 18.3 | 251 | 120< |
| 12 | S-3 | G-1 | 3 | 75.5 | 17.4 | 271 | 108 |
| 13 | S-4 | G-2 | 3 | 78.5 | 19.2 | 248 | 120< |
| 14 | S-5 | G-1 | 3 | 59.8 | 14.6 | 217 | 81 |
| 15 | S-6 | G-1 | 3 | 64.7 | 13.9 | 202 | 66 |
| 16 | S-7 | G-1 | 3 | 79.2 | 13.8 | 211 | 74 |
| 17 | S-8 | G-1 | 3 | 73.5 | 17.0 | 242 | 100 |
| 18 | S-9 | G-1 | 3 | 68.6 | 14.5 | 203 | 71 |
| Comparison Examples: | | | | | | | |
| 16 | Q-1 | G-1 | 3 | 48.1 | 11.2 | 130 | 13 |
| 17 | Q-2 | G-1 | 3 | 54.9 | 8.3 | 82 | 0 |
| 18 | Q-3 | G-1 | 3 | 47.1 | 10.9 | 124 | 7 |
| 19 | Q-4 | G-2 | 3 | 55.9 | 6.6 | 77 | 0 |
| 20 | Q-5 | G-1 | 3 | 69.6 | 5.5 | 82 | 0 |
| 21 | Q-6 | G-1 | 3 | 38.2 | 6.7 | 126 | 3 |
| 22 | Q-7 | G-1 | 3 | 40.2 | 7.1 | 131 | 6 |
| 23 | Q-8 | G-1 | 3 | * | * | * | * |
| 24 | Q-9 | G-1 | 3 | 64.7 | 4.2 | 84 | 0 |
| 25 | Q-10 | G-1 | 3 | 37.3 | 13.2 | 243 | 24 |
| 26 | Q-11 | G-1 | 3 | 38.2 | 5.8 | 62 | 0 |
| 27 | Q-12 | G-1 | 3 | 63.7 | 7.5 | 63 | 0 |
| 28 | Q-13 | G-1 | 3 | 65.7 | 8.0 | 72 | 0 |
| 29 | Q-14 | G-1 | 3 | 60.2 | 8.4 | 110 | 0 |
| 30 | Q-15 | G-1 | 3 | 45.3 | 11.6 | 233 | 12 |

In Table 3:
G-1: 1-hydroxy cyclohexyl phenylketone;
G-2: 2,2-dimethoxy-2-phenylacetone;
Amount of photoinitiator: Against 100 parts of photocurable liquid in photocurable resin composition;
*Fluidity of the liquid mixture was not sufficient and no layer could be formed, not enabling formation of plastic mold by stereolithography.

What is claimed is:

1. A photocurable resin composition capable of producing plastic molds, said composition comprising a photocurable liquid, 50–400 weight parts of a filler per 100 weight parts of said photocurable liquid, said filler being a mixture of inorganic fine particles and inorganic whiskers with average fiber length of 1–70 μm, 0.1–5 weight parts of a salt of phosphoric acid ester per 100 weight parts of said filler, said photocurable liquid being a mixture of unsaturated urethane and vinyl monomer at weight ratio of 80/20–40/60, said unsaturated urethane having within the molecule thereof at least three radical polymerizable groups including methacryloyl groups and acryloyl groups and having average molecular weight of 150–250 per said radical polymerizable group, said vinyl monomer being either N-(meth)acryloyl morpholine or a mixture of N-(meth) acryloyl morpholine and di-ol di(meth)acrylate, said inorganic whiskers being surface-treated with an agent selected from the group consisting of (meth)acryloyl modified silane and vinyl modified silane, said salt of phosphoric acid ester being shown by Formula (1) given below:

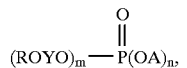

Formula (1)

where R is a hydrocarbon group with 1–6 carbon atoms, Y is a residual group obtained by removing hydroxyl groups of polyether di-ol, A is monoamine base and m and n are each 1 or 2 such that m+n=3.

2. The photocurable resin composition of claim 1 wherein said unsaturated urethane is a reaction product of diisocyanate, tri-ol monomethacrylate•monoacrylate and di-ol monomethacrylate or di-ol monoacrylate at molar ratio of 1/2/0 or 1/1/1.

3. The photocurable resin composition of claim 1 wherein said unsaturated urethane is a reaction product of diisocyanate, tri-ol monomethacrylate•monoacrylate and tri-ol dimethacrylate or tri-ol diacrylate at molar ratio of 1/1/1.

4. The photocurable resin composition of claim 1 wherein said unsaturated urethane is a reaction product of tri-ol, diisocyanate, tri-ol monomethacrylate•monoacrylate and di-ol monomethacrylate or diol monoacrylate, or tri-ol, diisocyanate, tri-ol monomethacrylate•monoacrylate and di-ol monomethacrylate or di-ol monoacrylate at molar ratio of 1/3/3/0, 1/3/2/1 or 1/3/1/2.

5. The photocurable resin composition of claim 1 wherein said unsaturated urethane is a reaction product of tetra-ol, diisocyanate, tri-ol monomethacrylate•monoacrylate and di-ol monomethacrylate or di-ol monoacrylate, or tetra-ol, di-isocyanate, tri-ol monomethacrylate•monoacrylate and a mixture of di-ol monomethacrylate and di-ol monoacrylate at molar ratio of 1/4/4/0, 1/4/3/1 or 1/4/2/2.

6. The photocurable resin composition of claim 1 wherein said unsaturated urethane has 3–8 radical polymerizable groups including methacryloyl groups and acryloyl groups at molar ratio of 1/3–3/1 per molecule and has average molecular weight of 150–215 per said radical polymerizable group.

7. The photocurable resin composition of claim 6 wherein said unsaturated urethane is a reaction product of aromatic diisocyanate, tri-ol monomethacrylate•monoacrylate and di-ol monomethacrylate or di-ol monoacrylate at molar ratio of 1/2/0 or 1/1/1.

8. The photocurable resin composition of claim 6 wherein said unsaturated urethane is a reaction product of trihydric or tetrahydric alcohol, aromatic diisocyanate and tri-ol monomethacrylate•monoacrylate at molar ratio of 1/(3 or 4)/(3 or 4).

9. The photocurable resin composition of claim 6 wherein said vinyl monomer is a mixture of over 50 weight % of N-acryloyl morpholine and less than 50 weight % of a specified kind of di-ol diacrylate, said specified kind of di-ol diacrylate being at least one selected from the group consisting of diacrylate of alkane di-ol with 2–6 carbon atoms, diacrylate of di-ols having alicyclic hydrocarbon group with 6–12 carbon atoms, diacrylate of ester di-ol obtained by reacting alkane di-ol with 2–6 carbon atoms with monohydroxy carboxylic acid with 4–6 carbon atoms, and diacrylate of alkoxylated bisphenols with alkoxyl group with 2–3 carbon atoms.

10. The photocurable resin composition of claim 9 wherein said inorganic fine particles comprise glass beads having average particle diameter of 3–30 μm and being surface-treated with (meth)acryloyl modified silane or vinyl modified silane.

11. The photocurable resin composition of claim 9 wherein said inorganic whiskers are aluminum borate fibers with fiber diameter of 0.3–1.0 μm and average fiber length of 10–20 μm.

12. The photocurable resin composition of claim 9 containing 40–300 weight parts of said inorganic fine particles and 10–100 weight parts of said inorganic whiskers per 100 weight parts of said photocurable liquid, said fine particles comprising glass beads having average particle diameter of 3–30 μm and being surface-treated with (meth)acryloyl modified silane or vinyl modified silane, and said inorganic whiskers comprising aluminum borate fibers with fiber diameter of 0.3–1.0 μm and average fiber length of 10–20 μm.

13. A plastic mold formed from a photocurable resin composition of claim 1 by stereolithography in the presence of a photoinitiator and an energy beam.

14. A plastic mold formed from a photocurable resin composition of claim 6 by stereolithography in the presence of a photoinitiator and an energy beam.

15. A plastic mold formed from a photocurable resin composition of claim 9 by stereolithography in the presence of a photoinitiator and an energy beam.

16. A plastic mold formed from a photocurable resin composition of claim 10 by stereolithography in the presence of a photoinitiator and an energy beam.

17. A plastic mold formed from a photocurable resin composition of claim 11 by stereolithography in the presence of a photoinitiator and an energy beam.

18. A plastic mold formed from a photocurable resin composition of claim 1 by stereolithography in the presence of a photoinitiator and an energy beam.

19. The plastic mold of claim 18 having heat distortion temperature of over 240° C. and tensile elastic modulus of larger than 17 GPa.

* * * * *